United States Patent
Kant

(12) 
(10) Patent No.: US 6,320,813 B1
(45) Date of Patent: Nov. 20, 2001

(54) DECODING OF A REGISTER FILE

(75) Inventor: Shree Kant, Fremont, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/517,372

(22) Filed: Mar. 2, 2000

(51) Int. Cl.$^7$ ..................................................... G11C 8/00
(52) U.S. Cl. ............................. 365/230.06; 365/230.03; 365/230.04; 712/208; 712/212; 712/1
(58) Field of Search ................. 365/230.01, 230.05, 365/230.04, 230.02, 230.06; 712/208, 212, 227, 200, 113; 714/35; 710/129; 711/127

(56) References Cited

U.S. PATENT DOCUMENTS

| | | | |
|---|---|---|---|
| 4,823,201 | * 4/1989 | Simon et al. | 375/240.08 |
| 4,873,630 | * 10/1989 | Rusterholz et al. | 712/3 |
| 5,657,291 | 8/1997 | Podlesny et al. | 365/230.05 |
| 5,721,868 | 2/1998 | Yung et al. | 395/476 |
| 5,761,475 | 6/1998 | Yung et al. | 395/394 |
| 5,764,943 | 6/1998 | Wechsler | 395/394 |
| 5,774,133 | * 6/1998 | Neave et al. | 345/505 |
| 5,778,248 | 7/1998 | Leung | 395/800.23 |
| 5,835,740 | * 11/1998 | Wise et al. | 710/129 |
| 5,842,033 | * 11/1998 | Wise et al. | 712/1 |
| 5,924,117 | * 7/1999 | Luick | 711/127 |
| 5,970,241 | * 10/1999 | Deao et al. | 712/227 |
| 6,016,555 | * 1/2000 | Deao et al. | 714/35 |
| 6,112,017 | * 8/2000 | Wise | 712/200 |
| 6,112,298 | * 8/2000 | Deao et al. | |

FOREIGN PATENT DOCUMENTS

360258662A * 12/1985 (JP) .
406103062A * 4/1994 (JP) .

* cited by examiner

*Primary Examiner*—Viet Q. Nguyen
(74) *Attorney, Agent, or Firm*—Thelen Reid & Priest LLP; Marc S. Hanish

(57) ABSTRACT

Decoding of addresses in a register file is simplified by reducing the number of bits used for addressing by one. Bits are read from even/odd cell combinations simultaneously, and a reserved address line is driven high. The reserved address line is coupled to each driver corresponding to a storage cell. Individual even cells may also be read. Writing to even/odd cell combinations may be performed in a similar manner. However, when writing, an even write enable line and an odd write enable line are provided to indicate whether an even cell, an odd cell, or an even/odd cell combination should be written to simultaneously. By simplifying the decoding stage, performance of reading and writing tasks may be performed much faster and use less resources.

23 Claims, 8 Drawing Sheets

DECODING OF A REGISTER FILE

BACKGROUND OF THE INVENTION

1. Field of the Invention

The present invention relates to parallel processing. More specifically, the present invention relates to the improved decoding of a configurable register file for faster initiation stages of parallel processing.

2. The Background

Parallel Processing involves the execution of multiple processes simultaneously. Numerous types of parallel processing schemes have been utilized, but a common scheme is Very Long Instruction Word (VLIW) schemes. VLIW processors use multiple, independent, functional units to execute the instructions in parallel. Generally, the multiple operations are combined into a single very long instruction. The multiple operations are determined by sub-instructions that are applied to the independent functional units.

A VLIW processor usually uses a technique known as trace scheduling to maintain a code sequence with sufficient operations to keep instructions scheduled by unrolling loops and scheduling code across basic function blocks. Trace scheduling may also improve efficiency by allowing instructions to move across branch points.

FIG. 1 is a schematic diagram illustrating a parallel processor. The processor 50 contains multiple media processor units 52, 54. Each media processor unit 52, 54 includes an instruction cache 56, an instruction aligner 58, an instruction buffer 60, a pipeline control unit 62, a split register file 64, a plurality of execution units 66, 68, 70, 72, and a load/store unit 74. The media processing units 52, 54 may use a plurality of execution units for executing instructions. The execution units 66, 68, 70, 72 may include three media functional units (MFU) 66, 68, 70 and one general function unit (GFU) 72. The MFUs 66, 68, 70 may be multiple single-instruction-multiple-datapath (MSMID) media functional units. Each of the MFUs 66, 68, 70 may be capable of processing 16-bit components. Various parallel 16-bit operations supply the dingle-instruction-multiple-datapath capability including add, multiply-add, shift, compare, and others. The MFUs 66, 68, 70 operate in combination as tightly-coupled digital signal processors (DSPs).

Each MFU 66, 68, 70 may have a separate and individual sub-instruction stream, but all the MFUs 66, 68, 70 execute synchronously so that the subinstructions lock-step through the pipeline stages.

The GFU may be a processor capable of executing arithmetic logic unit (ALU) operations, reciprocal square, and others. The GFU also may support less common parallel operations such as the parallel reciprocal square root instruction.

The instruction cache 56 may have a 16 Kbyte capacity and include hardware support to maintain coherence, allowing dynamic optimizations through self-modifying code. Software may be used to indicate that the instruction storage is being altered when modifications are made. Coherency may be maintained by hardware that supports write-through, non-allocating caching.

The pipeline control unit 62 may be connected between the instruction buffer 60 and the functional units 66, 68, 70, 72. The pipeline control unit 62 schedules the transfer of instructions to the functional units 66, 68, 70, 72. The pipeline control unit 60 also receives status signals from the functional units 66, 68, 70, 72 and a load/store unit 74 and uses the status signals to perform several control functions. The pipeline control unit 62 maintains a scoreboard, generates stalls and bypass controls. The pipeline control unit 62 also may generate traps and maintain special registers.

Each media processing unit 52, 54 includes a split register file 64, a single logical register file. The split register file 64 is split into a plurality of register file segments 76, 78, 80, 82 to form a multi-ported structure that is replicated to reduce the integrated circuit die area and to reduce access time. A separate register file segment 76, 78, 80, 82 is allocated to each of the media functional units 66, 68, 70 and the general functional unit 70. In the illustrative embodiment, each register file segment 76, 78, 80, 82 has 128 32-bit registers. The first 96 registers (0–95) in the register file segment 76, 78, 80, 82 are global registers. All the functional 66, 68, 70, 72 units may write to the 96 global registers. The global registers are coherent across all functional units (MFUs and GFU) 66, 68, 70, 72 so that any write operation to a global register by any functional unit is broadcast to all register file segments 76, 78, 80, 82. Registers 96–127 in the register file segments 76, 78, 80, 82 are local registers. Local registers allocated to a functional unit 66, 68, 70, 72 are not accessible or "visible" to other functional units 66, 68, 70, 72.

The media processing units 52, 54 are highly structured computation blocks that execute software-scheduled data computation operations with fixed, deterministic and relatively short instruction latencies, operational characteristics yielding simplification in both function and cycle time. The operational characteristics support multiple instruction issue through a very large instruction word (VLIW) approach that avoids hardware interlocks to account for software that does not schedule operations properly. Such hardware interlocks are typically complex, error-prone, and create multiple critical paths. A VLIW instruction word includes one instruction that executes in the general functional unit (GFU) 72 and from zero to three instructions that execute in the media functional units (MFU) 66, 68, 70. A MFU instruction field within the VLIW instruction word may include an operation code (opcode) field, three source register (or immediate) fields, and one destination register field.

Speed and ease of access are often problems encountered when dealing with register files. In order to solve these problems, register files are often split. FIG. 2 is a schematic block diagram illustrating a split register file 64. The split register file 64 supplies all operands of processor instructions that execute in the media functional units 66, 68, 70 and the (general functional units 72 and receives results of the instruction execution from the execution units. The split register file 64 is the source and destination of store and load operations, respectively.

Large, multiple-ported register files are typically metal-limited so that the register area is proportional with the square of the number of ports. A sixteen port file is roughly proportional in size and speed to a value of 256. The split register file 64 is divided into four register file segments 100, 102, 104, and 106, each having three read ports and four write ports so that each register file segment has a size and speed proportional to 49 for a total area for the four segments that is proportional to 196. The total area is therefore potentially smaller and faster than a single central register file. Write operations are fully broadcast so that all files are maintained coherent. Logically, the split register file 64 is no different from a single central register file, however, from the perspective of layout efficiency, the split register file 64 is smaller and has better performance.

Splitting the register file into multiple segments in the split register file 64 in combination with the character of data accesses in which multiple bytes are transferred to the plurality of execution units concurrently, results in a high utilization rate of the data supplied to the integrated circuit chip and effectively leads to a much higher data bandwidth than is supported on normal processors.

Normal applications often fail to exploit the large register file 64 because compilers do not effectively use the large number of registers in the split register file 64. However, aggressive in-lining techniques that have traditionally been restricted due to the limited number of registers in conventional systems may be used in the processor 50 to exploit the large number of registers in the split register file 64. In a software system that exploits the large number of registers in the processor 50, the complete set of registers is saved upon the event of a thread (context) switch. When only a few registers of the entire set of registers is used, saving all registers in the full thread switch is wasteful. Waste is avoided in the processor 50 by supporting individual marking of registers. Octants of the thirty-two registers can be marked as "dirty" if used, and are consequently saved conditionally.

These multiport register files can have large delays when accessed for read or write operations. When a register address is specified, it must be decoded by decoding circuitry. What is needed is a way to simplify the decoding circuitry such that register cells may be accessed with less delay and still incorporating all the functionality required without any additional logic.

SUMMARY OF THE INVENTION

Decoding of addresses in a register file is simplified by reducing the number of bits used for addressing by one. Bits are read from even/odd cell combinations simultaneously, and a reserved address line is driven high. The reserved address line is coupled to each driver corresponding to a storage cell. Individual even cells may also be read. Writing to even/odd cell combinations may be performed in a similar manner. However, when writing, an even write enable line and an odd write enable line are provided to indicate whether an even cell, an odd cell, or an even/odd cell combination should be written to simultaneously. By simplifying the decoding stage, performance of reading and writing tasks may be performed much faster and use less resources.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons after review of this disclosure.

Figure 1:
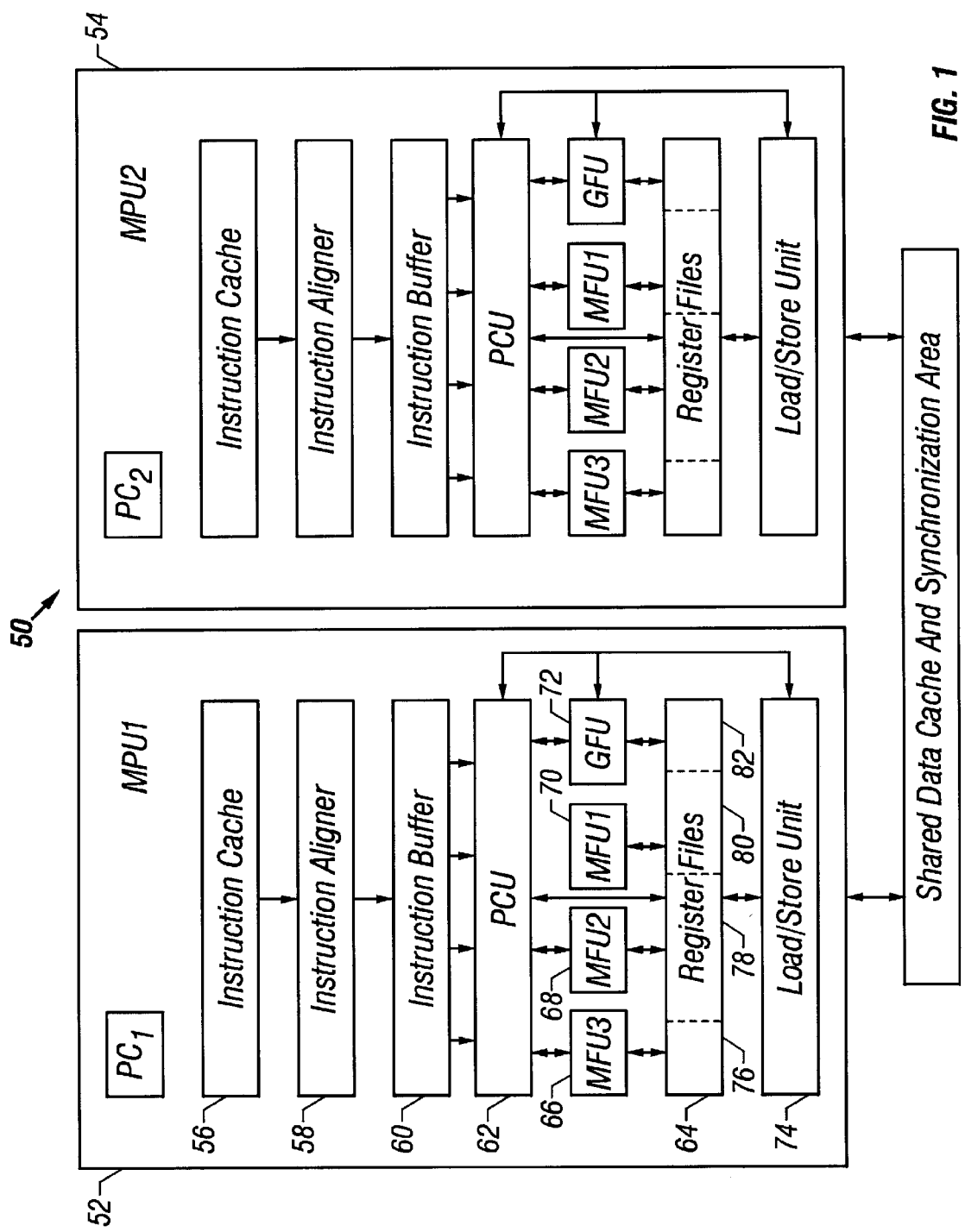
FIG. 1 is a schematic diagram illustrating a parallel processor.
Figure 2:
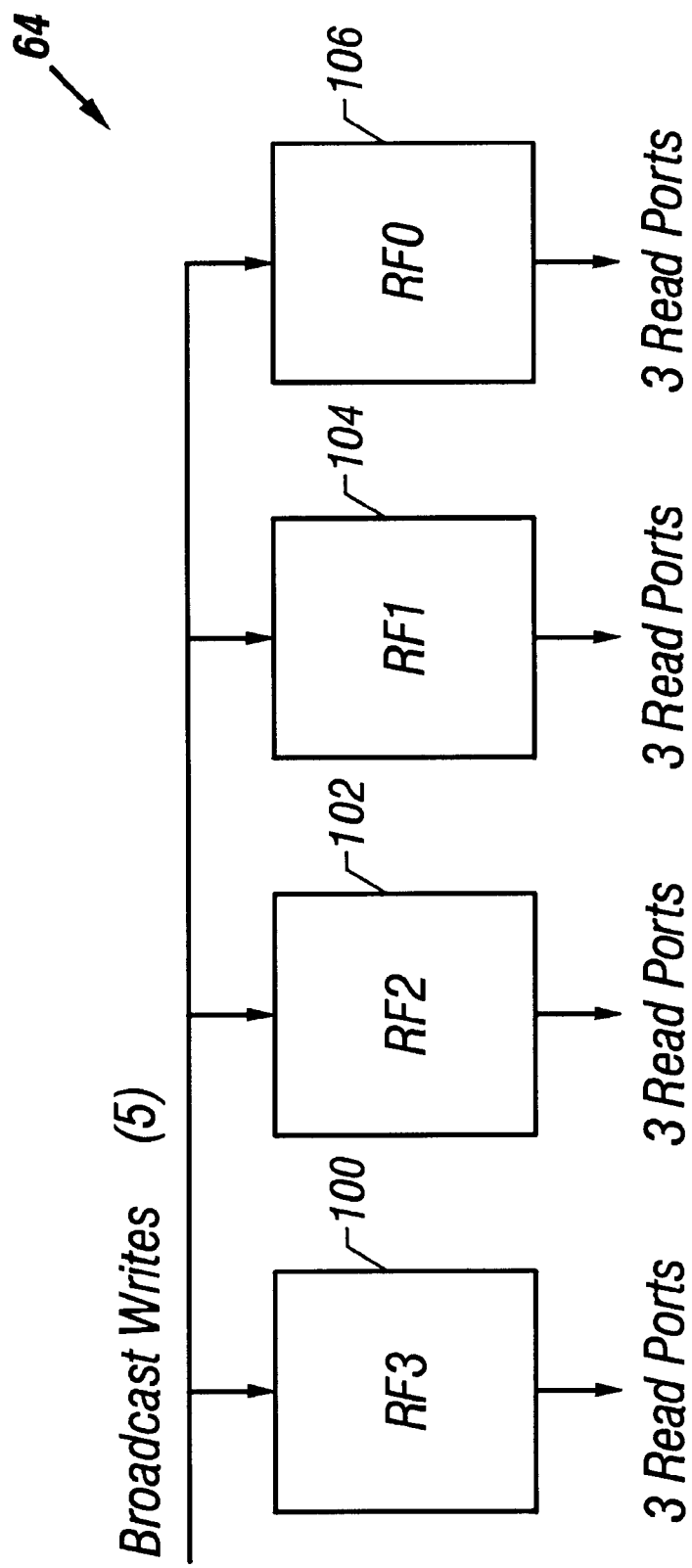
FIG. 2 is a schematic block diagram illustrating a split register file.
Figure 3:
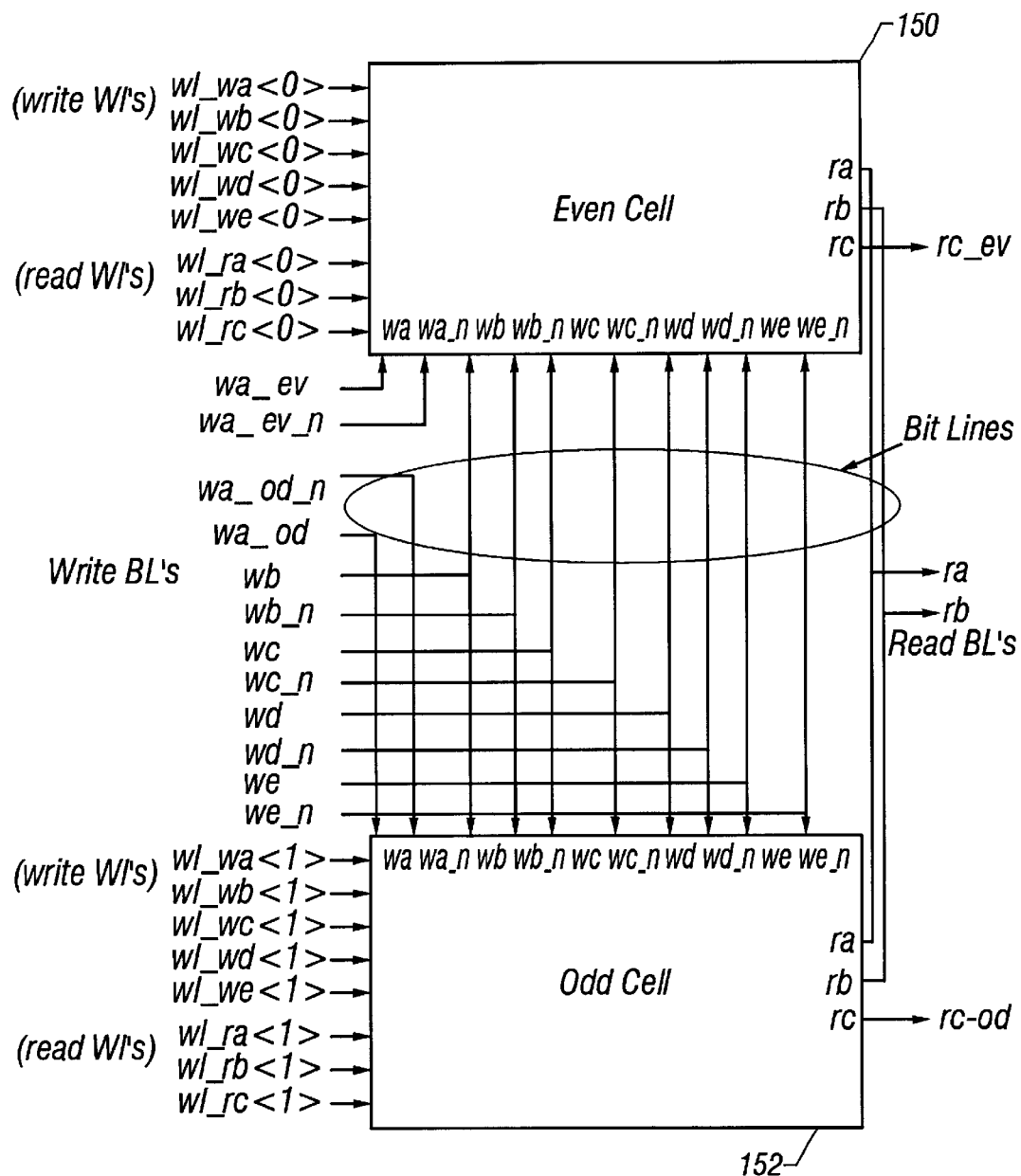
FIG. 3 is a schematic block diagram illustrating the 32/64 bit read and write configuration of even and odd storage cells in accordance with a presently preferred embodiment of the present invention.

FIG. 3 is a schematic block diagram illustrating the 32/64 bit read and write configuration of even and odd storage cells in accordance with a presently preferred embodiment of the present invention. Write port wa has write bit line wa_ev writing to the even cell 150 and wa_od writing to the odd cell 152. Read port rc has bit line rc_ev reading from the even cell 150 and rc_od reading from the odd cell 152.

Figure 4:
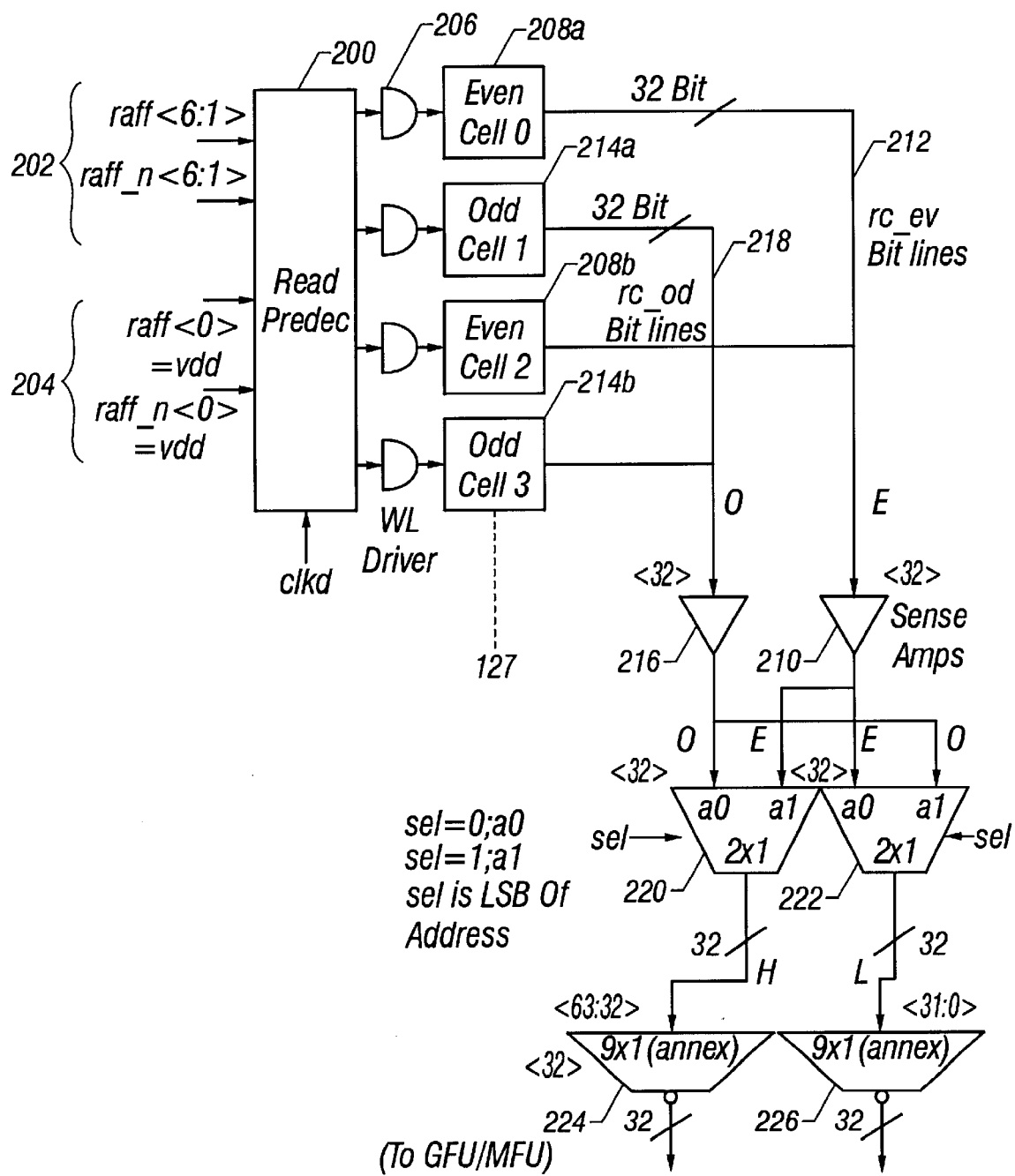
FIG. 4 is a schematic block diagram illustrating a read circuit in accordance with a presently preferred embodiment of the present invention.

FIG. 4 is a schematic block diagram illustrating a read circuit in accordance with a presently preferred embodiment of the present invention. The register file includes 128 registers. Rather than using all the address bits for the decoding of the address, the present invention provides driving one of the bits high all the time. A predecoding circuit 200 receives a seven-bit address, however only the 6-bit address fields 202 are used as part of the address. The least significant bit (LSB) of the address 204 is always driven high. The LSB of the address 204 is not decoded in the predecoding circuit, and is simply passed as always-on inputs to the drivers 206, which are logical AND or NAND gates, and may also be called address drivers. One of ordinary skill in the art will recognize that any one of the bits may be reserved to be driven high, it does not have to be the least significant bit. For purposes of this application, this will be known as the reserved address.

In a presently preferred embodiment of the present invention with 7-bit addressing, the reserved address is constantly driven high. By driving the reserved address constantly high, the address selected will always be an even cell. A 64-bit read operation is performed by reading from rs1(n) and rs1(n+1), where n is an even address. A 32-bit read operation may also be performed by reading from rs1(n), where n is an even address.

This reduces a certain amount of complexity from the decoding stage, as only a 6-bit address needs to be decoded rather than a 7-bit, while still maintaining the same amount of storage capacity and speed.

When a storage cell is activated by the driver 206, the storage cell generates data signals on bitlines. The even cells 208a, 208b generate data signals that are applied to even sense amplifiers 210 via even bitlines rc-ev 212. The odd cells 214a, 214b generate data signals that are applied to odd sense amplifiers 216 via odd bitlines rc-od 218.

Amplified signals are multiplexed at multiplexers 220 and 222 and respectively applied to a high annex 224 and a low annex 226. The annexes supply signals to the general functional unit or media functional units.

Figure 5:
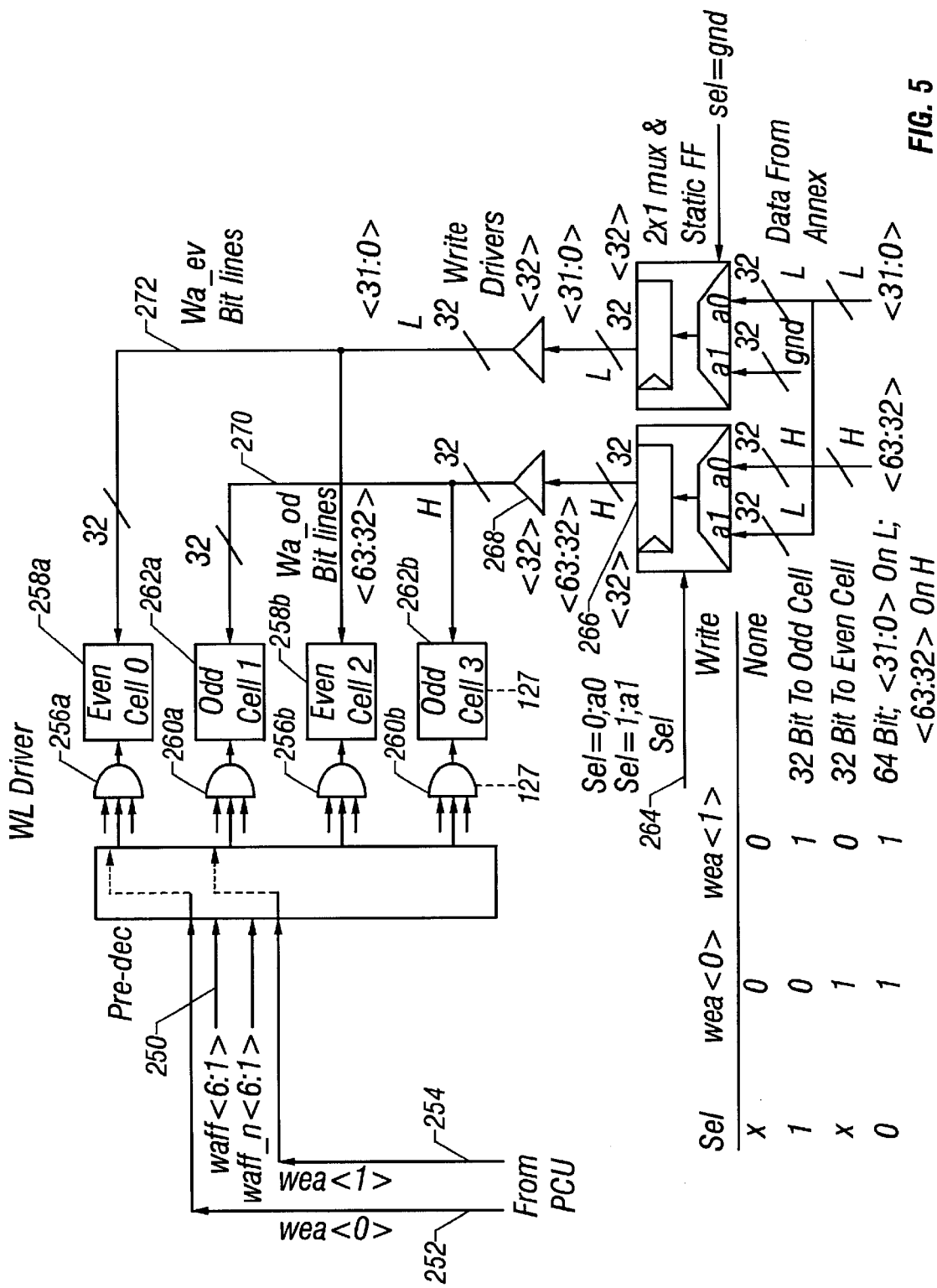
FIG. 5 is a schematic block diagram illustrating a write circuit in accordance with a presently preferred embodiment of the present invention.

FIG. 5 is a block diagram illustrating a write circuit in accordance with a presently preferred embodiment of the present invention. As with the read circuit, one bit normally used for addressing is not used for addressing. However, with the write circuit, rather than simply driving this bit high, an extra bit is added and the two bits are used to determine to which of each even/odd cell pairs to write. These bits are called write enable bits (wea).

The register file includes 128 registers. In a presently preferred embodiment of the present invention with 7-bit addressing, only the 6-bit address fields 250 are actually used for addressing. A wea<0> 252 and wea<1> 254 bits are provided. The wea<0> line 242 is tied to each driver 256a, 256b coupled to an even cell 258a, 258b, while the wea<1> line 254 is tied to each driver 260a, 260b coupled to an odd cell 262a, 262b. By driving the reserved address constantly high, the address selected will always be an even cell. A 64-bit read operation is performed by reading from rs1(n) and rs1(n+1), where n is an even address. A 32-bit read operation may also be performed by reading from rs1(n), where n is an even address.

While the 6-bit address fields 250 indicate which even/ odd pair to access, the wea<0> bit 252 and wea<1> 254 bit determine whether to write to none of the cells, the even cell only, the odd cell only, or both cells simultaneously. The following table illustrates how this determination is made.

| sel | wea<0> | wea<1> | Write |
|---|---|---|---|
| x | 0 | 0 | None |
| 1 | 0 | 1 | 32-bit write to odd |
| x | 1 | 0 | 32-bit write to even |
| 0 | 1 | 1 | 64 bit write to both |

The sell line 264 is used as input to a 2×1 static mux 266 coupled to a write driver 268 attached to odd bit lines 270. A similar mux and drive combination is coupled to even bit lines 272.

This reduces a certain amount of complexity from the decoding stage, as only a 6-bit address needs to be decoded rather than a 7-bit, while still maintaining the same amount of storage capacity and speed. The wea<0> and wea<1> lines need not be decoded, as they pass directly to even and odd drivers, respectively. This design also allows for the individual writing to odd cells.

Figure 6:
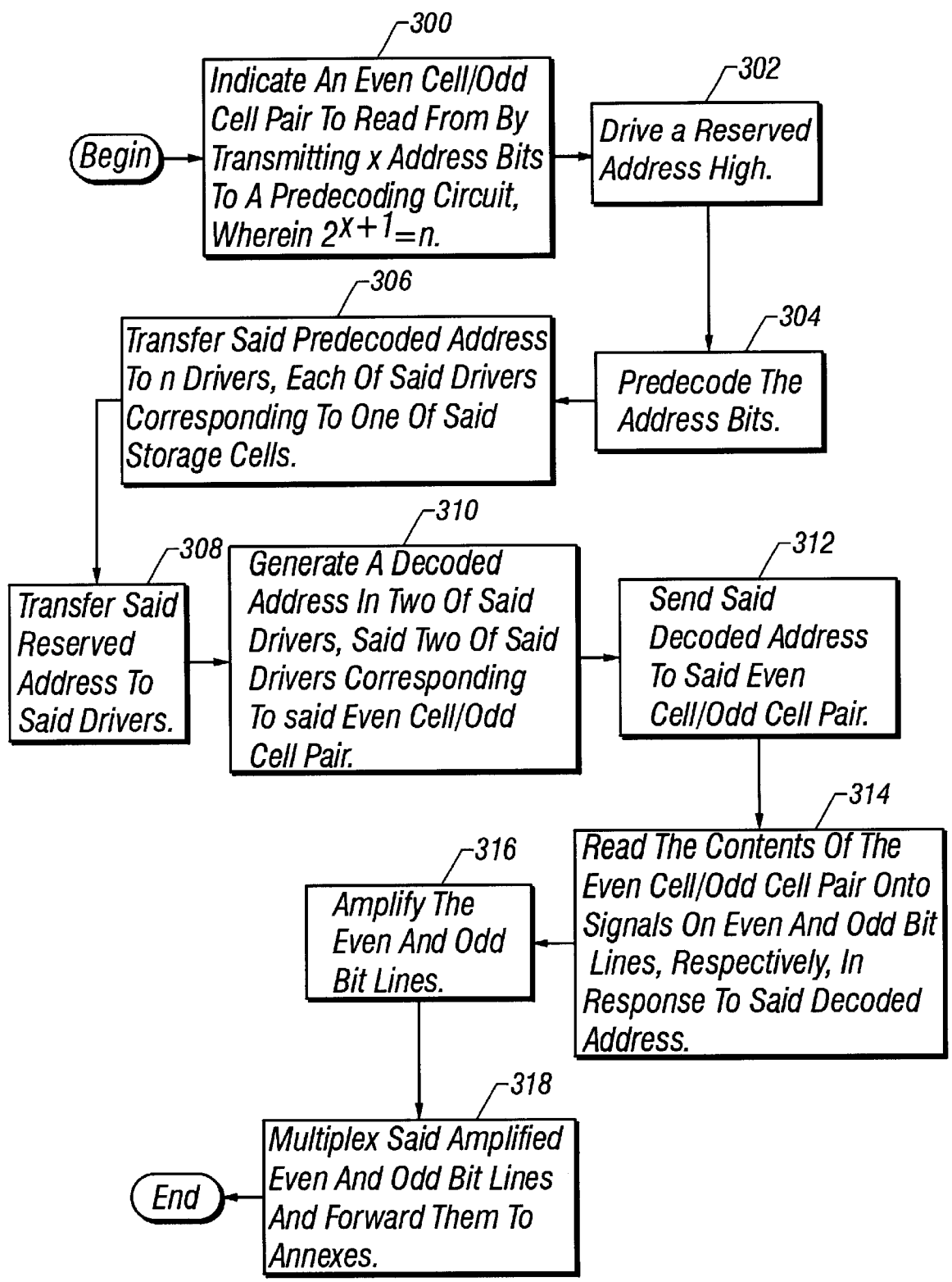
FIG. 6 is a flow diagram illustrating a method for reading information from a register file in accordance with a presently preferred embodiment of the present invention.

FIG. 6 is a flow diagram illustrating a method for reading information from a register file in accordance with a presently preferred embodiment of the present invention. In this embodiment, 64-bit reading is enabled. The register file has n storage cells, where n is an even number greater than 0. The storage cells are divided into even and odd cells. First, at 300, an even cell/odd cell pair to read from is indicated by transmitting x address bits to a predecoding circuit, wherein $2^{x+1}=n$. Then, at 302, a reserved address is driven high. At 304, said address bits are decoded.

An predecoded address is formed by predecoding circuitry, which is then transferred at 306 to n drivers, each of said drivers corresponding to one of said storage cells. At 308, said reserved address is transferred to said drivers. The drivers act as a predecoding circuit. Then, at 310 a decoded address is generated in two of said drivers, said two of said drivers corresponding to said even cell/odd cell pair. At 312, the decoded address is sent to said even cell/odd cell pair. Then at 314, the contents of the even cell/odd cell pair are read onto signals on even and odd bit lines, respectively, in response to said decoded address. At 316, the even and odd bit lines are amplified. Finally, at 318, the amplified even and odd bit lines are multiplexed and forwarded to annexes.

Figure 7:
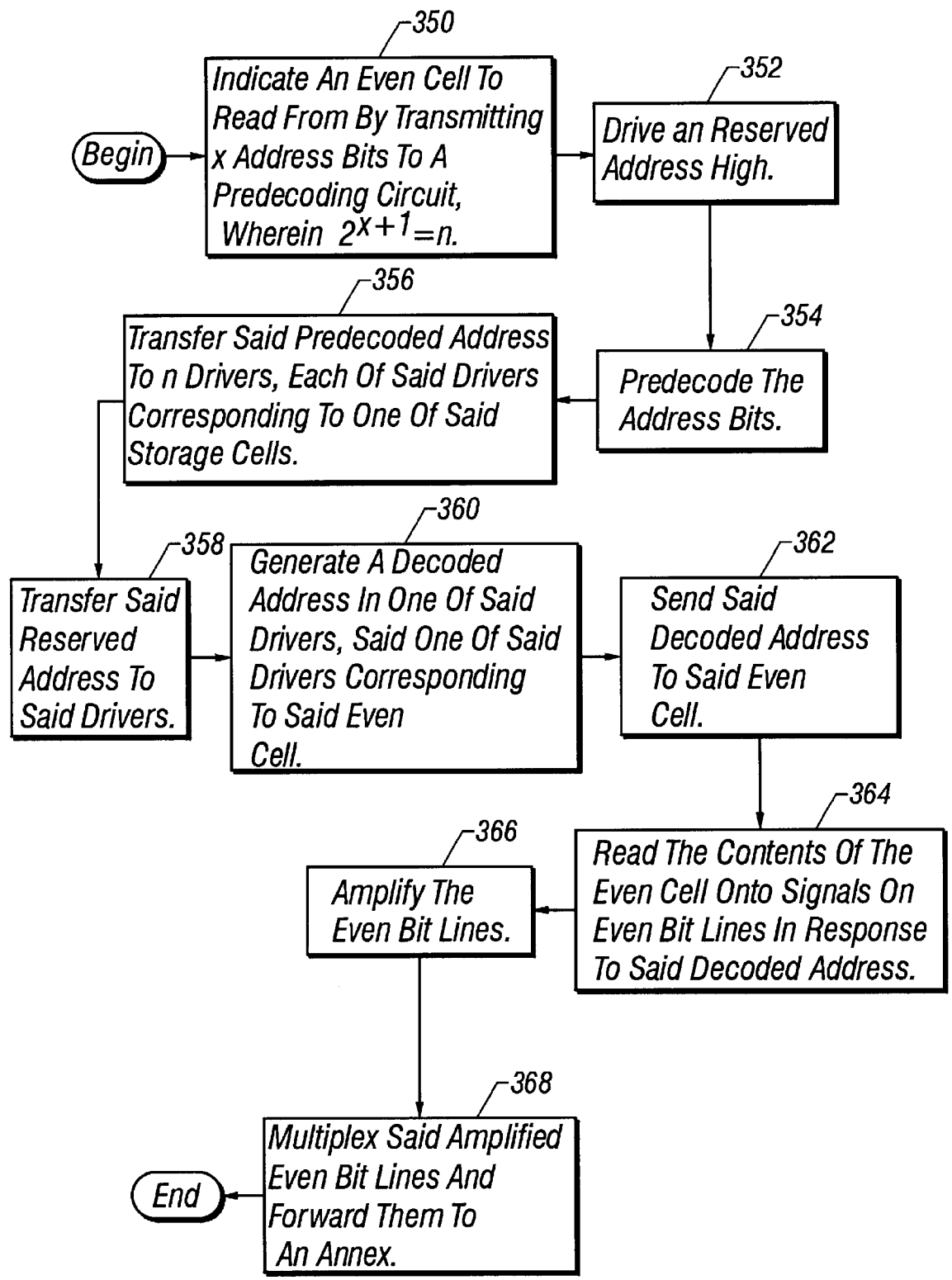
FIG. 7 is a flow diagram illustrating a method for reading information from a register file in accordance with another embodiment of the present invention.

FIG. 7 is a flow diagram illustrating a method for reading information from a register file in accordance with another embodiment of the present invention. In this embodiment, 32-bit reading is enabled. The register file has n storage cells, where n is an even number greater than 0. The storage cells are divided into even and odd cells. First, at 350, an even cell to read from is indicated by transmitting x address bits to a predecoding circuit, wherein $2^{x+1}=n$. Then, at 352, a reserved address is driven high. At 354, said address bits are decoded.

An predecoded address is formed by predecoding circuitry, which is then transferred at 356 to n drivers, each of said drivers corresponding to one of said storage cells. At 358, said reserved address is transferred to said drivers. The drivers act as a predecoding circuit. Then, at 360 a decoded address is generated in one of said drivers, said one of said drivers corresponding to said even cell. At 362, the decoded address is sent to said even cell. Then at 364, the contents of the even cell are read onto signals on even bit lines, in response to said decoded address. At 366, the even bit lines are amplified. Finally, at 318, the amplified even bit lines are multiplexed and forwarded to an annex.

Figure 8:
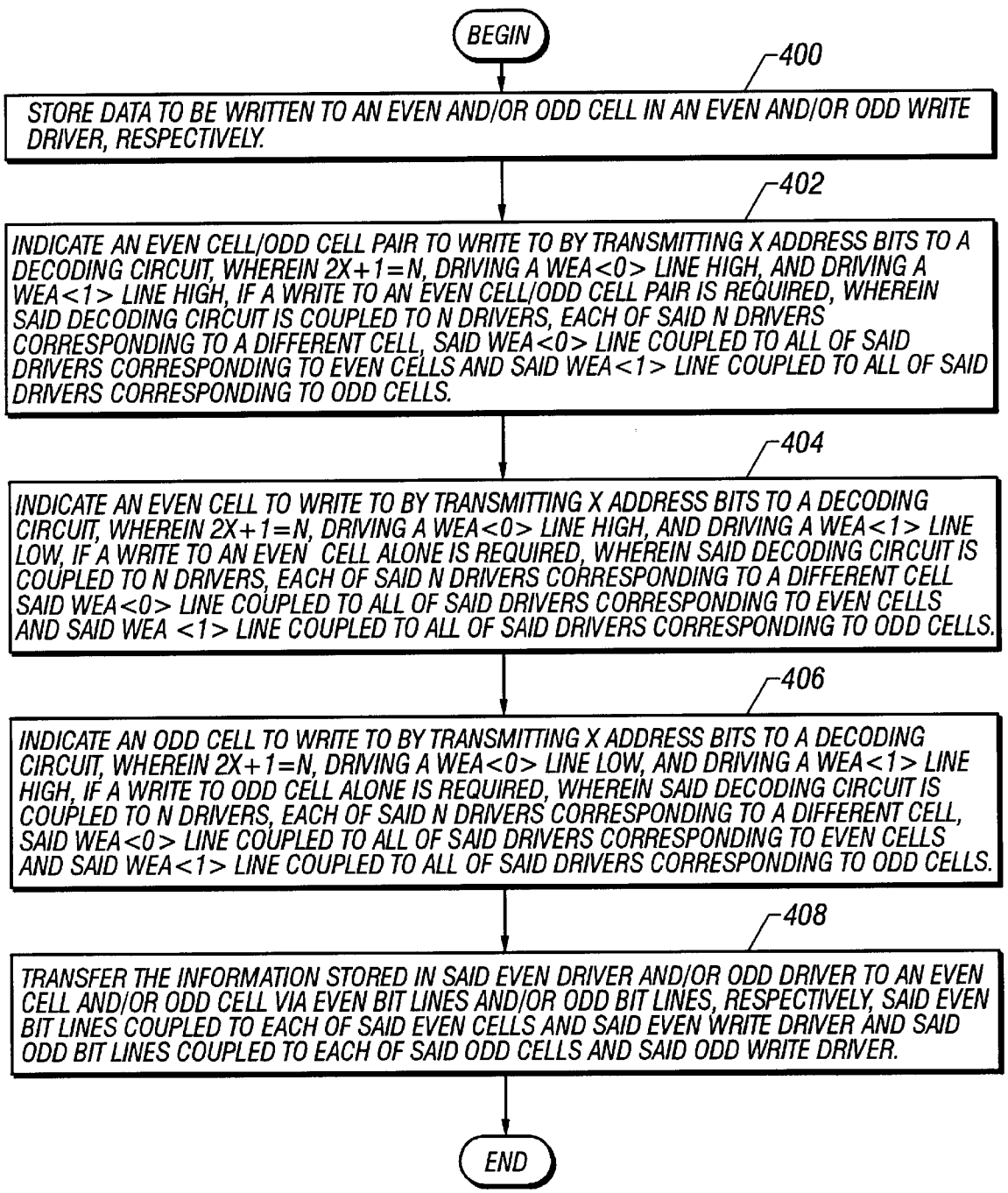
FIG. 8 is a flow diagram illustrating a method for writing information from a register file in accordance with a presently preferred embodiment of the present invention.

FIG. 8 is a flow diagram illustrating a method for writing information from a register file in accordance with a presently preferred embodiment of the present invention. In this embodiment, either 64 or 32-bit reading is enabled. The register file has n storage cells, where n is an even number greater than 0. The storage cells are divided into even and odd cells. First, at 400, data to be written to an even and/or odd cell is stored in an even and/or odd write driver, respectively. At 402, an even cell/odd cell pair to write to is indicated by transmitting x address bits to a predecoding circuit, wherein $2^{x+1}=n$, driving a wea<0> line high, and driving a wea<1> line high, if a write to an even cell/odd cell pair is required, wherein said predecoding circuit is coupled to n drivers, each of said n drivers corresponding to a different cell, said wea<0> line coupled to all of said drivers corresponding to even cells and said wea<1> line coupled to all of said drivers corresponding to odd cells. At 404, an even cell to write to is indicated by transmitting x address bits to a predecoding circuit, wherein $2^{x+1}=n$, driving a wea<0> line high, and driving a wea<1> line low, if a write to an even cell alone is required, wherein said predecoding circuit is coupled to si drivers, each of said n drivers corresponding to a different cell, said wea<0> line coupled to all of said drivers corresponding to even cells and said wea<1> line coupled to all of said drivers corresponding to odd cells. At 406, an odd cell to write to is indicated by transmitting x address bits to a predecoding circuit, wherein $2^{x+1}=n$, driving a wea<0> line low, and driving a wea<1> line high, if a write to odd cell alone is required, wherein said predecoding circuit is coupled to n drivers, each of said n drivers corresponding to a different cell, said wea<0> line coupled to all of said drivers corresponding to even cells and said wea<1> line coupled to all of said drivers corresponding to odd cells.

Finally, at 408, the information stored in said even driver and/or odd driver is transferred to an even cell and/or an odd cell via even bit lines and/or odd bit lines, respectively, said even bit lines coupled to each of said even cells and said even write driver and said odd bit lines coupled to each of said odd cells and said odd write driver.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A register file including:
   n storage cells, wherein n is an even number greater than 0, said storage cells divided into even cells and odd cells;

a predecoding circuit, said predecoding circuit having as input x address bits, where $2^{x+1}=n$, and an reserved address line which is always driven high, said predecoding circuit having as output lines indicating a decoded address and said reserved address line; and n drivers, each of said n drivers being a logical AND gate having an output coupled to one of said storage cells and having as input said lines indicating a decoded address and said reserved address line.

2. The register file of claim 1, further including an odd sense amplifier and an even sense amplifier, said even sense amplifier coupled to each of said even cells via even bit lines, and said odd sense amplifier coupled to each of said odd cells via odd bit lines.

3. The register file of claim 2, wherein said even sense amplifier is coupled to each of said even cells via even bit lines, and said odd sense amplifier is coupled to each of said odd cells via odd bit lines, such that when one of said drivers activates a corresponding cell, the contents of the cell are transferred to the sense amplifier via corresponding bit lines.

4. The register file of claim 2, further including two multiplexors, each of said multiplexors coupled to each of said sense amplifiers.

5. The register file of claim 4, further including two annexes, each of said annexes coupled to a different one of said two multiplexors.

6. A register file including:

n storage cells, wherein n is an even number greater than 0, said storage cells divided into even cells and odd cells;

a predecoding circuit, said predecoding circuit having as input x address bits, where $2^{x+1}=n$, an even write enable line, and an odd write enable line, said predecoding circuit having as output lines indicating a decoded address and said two write enable lines; and n address drivers, each of said n address drivers being a logical AND gate having an output coupled to one of said storage cells and having as input said lines indicating a decoded address; and wherein each of said n address drivers corresponding to an even cell further has as input said even write enable line and each of said n drivers corresponding to an odd cell further has as input said odd write enable line.

7. The register file of claim 6, further including an odd write driver and an even write driver, said even write driver coupled to each of said even cells via even bit lines, and said write driver coupled to each of said odd cells via odd bit lines.

8. The register file of claim 7, wherein said even write driver is coupled to each of said even cells via even bit lines, and said odd write driver is coupled to each of said odd cells via odd bit lines, such that when one of said address drivers activates a corresponding cell, the contents in the write drivers are transferred to corresponding cell or cells.

9. The register file of claim 7, further including two multiplexors, each of said multiplexors coupled to a different one of said write drivers.

10. The register file of claim 9, further including two annexes, each of said annexes coupled to each of said two multiplexors.

11. A method for reading information from a register file, said register file having n storage cells, wherein n is an even number greater than 0, said storage cells divided into even cells and odd cells, the method comprising:

indicating an even cell/odd cell pair to read from by transmitting x address bits to a predecoding circuit, wherein $2^{x+1}=n$;

driving a reserved address high;

predecoding said address bits;

transferring said predecoded address to n drivers, each of said drivers corresponding to one of said storage cells;

transferring said reserved address to said drivers;

generating a decoded address in two of said drivers, said two of said drivers corresponding to said even cell/odd cell pair; and sending said decoded address to said even cell/odd cell pair.

12. The method of claim 11, further including reading the contents of said even cell/odd cell pair in response to said decoded address.

13. The method of claim 12, wherein said reading includes reading the contents of said even cell/odd cell pair onto signals on even and odd bit lines, respectively.

14. The method of claim 13, further including amplifying said signals on said even and odd bit lines.

15. A method for reading information from a register file, said register file having n storage cells, wherein n is an even number greater than 0, said storage cells divided into even cells and odd cells, the method comprising:

indicating an even cell to read from by transmitting x address bits to a predecoding circuit, wherein $2^{x+1}=n$;

driving a reserved address high;

predecoding said address bits;

transferring said predecoded address to n drivers, each of said drivers corresponding to one of said storage cells;

transferring said reserved address to said drivers;

generating a decoded address in one of said drivers, said one of said drivers corresponding to said even cell; and sending said decoded address to said even cell pair.

16. The method of claim 15, further including reading the contents of said even cell in response to said decoded address.

17. The method of claim 16, wherein said reading includes reading the contents of said even cell onto signals on even bit lines.

18. The method of claim 17, further including amplifying said signals on said even bit lines.

19. A method for writing information from a register file, said register file having n storage cells, wherein n is an even number greater than 0, said storage cells divided into even cells and odd cells, the method comprising:

indicating an even cell/odd cell pair to write to by transmitting x address bits to a predecoding circuit, wherein $2^{x+1}=n$, driving an even write enable line high, and driving an odd write enable line high, if a write to an even cell/odd cell pair is required, wherein said predecoding circuit is coupled to n drivers, each of said n drivers corresponding to a different cell, said even write enable line coupled to all of said drivers corresponding to even cells and said odd write enable line coupled to all of said drivers corresponding to odd cells;

indicating an even cell to write to by transmitting x address bits to a predecoding circuit, wherein $2^{x+1}=n$, driving an even write enable line high, and driving an odd write enable line low, if a write to an even cell alone is required, wherein said predecoding circuit is coupled to n drivers, each of said n drivers corresponding to a different cell, said even write enable line coupled to all of said drivers corresponding to even cells and said odd write enable line coupled to all of said drivers corresponding to odd cells; and indicating an odd cell to write to by transmitting x address bits to a predecoding circuit, wherein $2^{x+1}=n$, driving an even write enable line low, and driving an odd write enable line high, it a write to odd cell alone is required, wherein said predecoding circuit is coupled to n drivers, each of said n drivers corresponding to a different cell, said even write enable line coupled to all of said drivers corresponding to even cells and said odd write enable line coupled to all of said drivers corresponding to odd cells.

20. The method of claim 19, further including writing information to an even cell and/or an odd cell via even bit lines and/or odd bit lines respectively, said even bit lines coupled to each of said even cells and said odd bit lines coupled to each of said odd bit lines.

21. A program storage device readable by a machine, tangibly embodying a program of instructions executable by the machine to perform a method for reading information from a register file, said register file having n storage cells, wherein n is an even number greater than 0, said storage cells divided into even cells and odd cells, the method comprising:

indicating an even cell/odd cell pair to read from by transmitting x address bits to a predecoding circuit, wherein $2^{x+1}=n$;

driving a reserved address high;

predecoding said address bits;

transferring said predecoded address to n drivers, each of said drivers corresponding to one of said storage cells;

transferring said reserved address to said drivers;

generating a decoded address in two of said drivers, said two of said drivers corresponding to said even cell/odd cell pair; and sending said decoded address to said even cell/odd cell pair.

22. A program storage device readable by a machine, tangibly embodying a program of instructions executable by the machine to perform a method for reading information from a register file, said register file having n storage cells, wherein n is an even number greater than 0, said storage cells divided into even cells and odd cells, the method comprising:

indicating an even cell to read from by transmitting x address bits to a predecoding circuit, wherein $2^{x+1}=n$;

driving a reserved address high;

predecoding said address bits;

transferring said predecoded address to n drivers, each of said drivers corresponding to one of said storage cells;

transferring said reserved address to said drivers;

generating a decoded address in one of said drivers, said one of said drivers corresponding to said even cell; and sending said decoded address to said even cell pair.

23. A program storage device readable by a machine, tangibly embodying a program of instructions executable by the machine to perform a method for writing information from a register file, said register file having n storage cells, wherein n is an even number greater than 0, said storage cells divided into even cells and odd cells, the method comprising:

indicating an even cell/odd cell pair to write to by transmitting x address bits to a predecoding circuit, wherein $2^{x+1}=n$, driving an even write enable line high, and driving an odd write enable line high, if a write to an even cell/odd cell pair is required, wherein said predecoding circuit is coupled to n drivers, each of said n drivers corresponding to a different cell, said even write enable line coupled to all of said drivers corresponding to even cells and said odd write enable line coupled to all of said drivers corresponding to odd cells;

indicating an even cell to write to by transmitting x address bits to a predecoding circuit, wherein $2^{x+1}=n$, driving an even write enable line high, and driving an odd write enable line low, if a write to an even cell alone is required, wherein said predecoding circuit is coupled to n drivers, each of said n drivers corresponding to a different cell, said even write enable line coupled to all of said drivers corresponding to even cells and said odd write enable line coupled to all of said drivers corresponding to odd cells; and indicating an odd cell to write to by transmitting x address bits to a predecoding circuit, wherein $2^{x+1}=n$, driving an even write enable line low, and driving an odd write enable line high, it a write to odd cell alone is required, wherein said predecoding circuit is coupled to n drivers, each of said n drivers corresponding to a different cell, said even write enable line coupled to all of said drivers corresponding to even cells and said odd write enable line coupled to all of said drivers corresponding to odd cells.

* * * * *